United States Patent
He et al.

(10) Patent No.: US 10,031,159 B2
(45) Date of Patent: Jul. 24, 2018

(54) SOLDERLESS TEST FIXTURE FOR TRIMMED COAXIAL CABLE OR RELATED PRODUCTS

(71) Applicant: CommScope Technologies LLC, Hickory, NC (US)

(72) Inventors: Jinchun He, Suzhou (CN); HuaFeng Su, Suzhou (CN); Qiang Wang, Suzhou (CN); Junfeng Yu, Suzhou (CN); Peter J. Bisiules, LaGrange Park, IL (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 15/241,867

(22) Filed: Aug. 19, 2016

(65) Prior Publication Data
US 2017/0052215 A1    Feb. 23, 2017

(30) Foreign Application Priority Data
Aug. 19, 2015   (CN) .......................... 2015 1 0511671

(51) Int. Cl.
G01R 1/04       (2006.01)
G01R 31/02      (2006.01)
G01R 31/315     (2006.01)

(52) U.S. Cl.
CPC ......... G01R 1/0416 (2013.01); G01R 31/021 (2013.01); G01R 31/315 (2013.01)

(58) Field of Classification Search
None
See application file for complete search history.

(56) References Cited

U.S. PATENT DOCUMENTS

| | | | | |
|---|---|---|---|---|
| 2,548,598 A * | 4/1951 | Feiker, Jr. | ............. | G01N 22/02 324/543 |
| 3,309,632 A * | 3/1967 | Trudeau | ................. | H01P 1/045 333/260 |
| 4,647,844 A * | 3/1987 | Biegon | ................ | G01R 31/021 324/627 |
| 5,075,630 A * | 12/1991 | Babbitt | ................... | G01R 1/045 324/629 |
| 5,378,992 A * | 1/1995 | Murphy | ............... | G01R 31/021 324/543 |
| 5,825,190 A * | 10/1998 | Van Der Laan | ... | G01R 19/0092 324/615 |
| 9,871,498 B2 * | 1/2018 | Ooi | ..................... | G01R 29/0878 |
| 2003/0107382 A1 * | 6/2003 | Kreager | ............... | G01R 1/0408 324/538 |
| 2003/0128037 A1 * | 7/2003 | Christopherson | .... | G01R 31/021 324/543 |
| 2007/0201178 A1 * | 8/2007 | Reykowski | ........... | G01R 33/36 361/119 |
| 2016/0079688 A1 * | 3/2016 | Harwath | .................. | H01R 4/26 439/578 |
| 2016/0365683 A1 * | 12/2016 | Watkins | ............... | H01R 9/0527 |

* cited by examiner

*Primary Examiner* — Patrick Assouad
*Assistant Examiner* — Demetrius Pretlow
(74) *Attorney, Agent, or Firm* — Myers Bigel, P.A.

(57) ABSTRACT

A test fixture for testing performance of a trimmed cable and/or antenna components. The test fixture may be connected without the use of solder allowing for accurate testing or tuning of one or more the antenna components.

10 Claims, 7 Drawing Sheets

SOLDERLESS TEST FIXTURE FOR TRIMMED COAXIAL CABLE OR RELATED PRODUCTS

RELATED APPLICATION

This application claims priority from and the benefit of Chinese Patent Application No. 201510511671.9, filed Aug. 19, 2015, the disclosure of which is hereby incorporated herein in its entirety.

BACKGROUND

Many factors affect performance of an antenna. Some of these factors are directly related to individual components of the antenna, including but not limited to diplexers, filters, and trimmed cables (e.g., coaxial cable having at least an outer portion trimmed off). As such, performance parameters of these components are often tested. For example, antenna components may be tested for discontinuities that may result in passive intermodulation (PIM). Other performance parameters tested may include, but are not limited to, return loss and isolation performance. Further, it is advantageous for components to be tested prior to their integration into the antenna.

Some current techniques are expensive and fallible, at least because parts of the test fixture and other parts needed for testing, such as Deutsches Institut für Normung (or "DIN") connectors, may be soldered on and then cut off and discarded after each test. Occasionally, the soldering of the connectors or any test fixture components may be faulty, requiring additional time and expense to re-do a soldered connection.

Accordingly, it may be advantageous to have a solderless test fixture for testing cables and/or other devices, which may allow for quick assembly, and disassembly, which may save labor, time, and cost.

SUMMARY OF THE DISCLOSURE

Various aspects of the present disclosure may be directed to a solderless test fixture for testing performance of at least one cable and/or at least one antenna component. In one aspect, the solderless test fixture may comprise a base and at least one frame mounted on the base. Each of the at least one frame may include a choke cover including a first cavity, and a test body connected to the choke cover. The test body may include a second cavity. At least a portion of the first cavity and at least a portion of the second cavity may define a radio frequency (RF) choke for the at least one cable.

BRIEF DESCRIPTION OF THE SEVERAL VIEWS OF THE DRAWINGS

The following detailed description of the disclosure will be better understood when read in conjunction with the appended drawings. For the purpose of illustrating the disclosure, there are shown in the drawings embodiments which are presently preferred. It should be understood, however, that the disclosure is not limited to the precise arrangements and instrumentalities shown.

In the drawings.

DETAILED DESCRIPTION OF VARIOUS EMBODIMENTS

Figure 1:
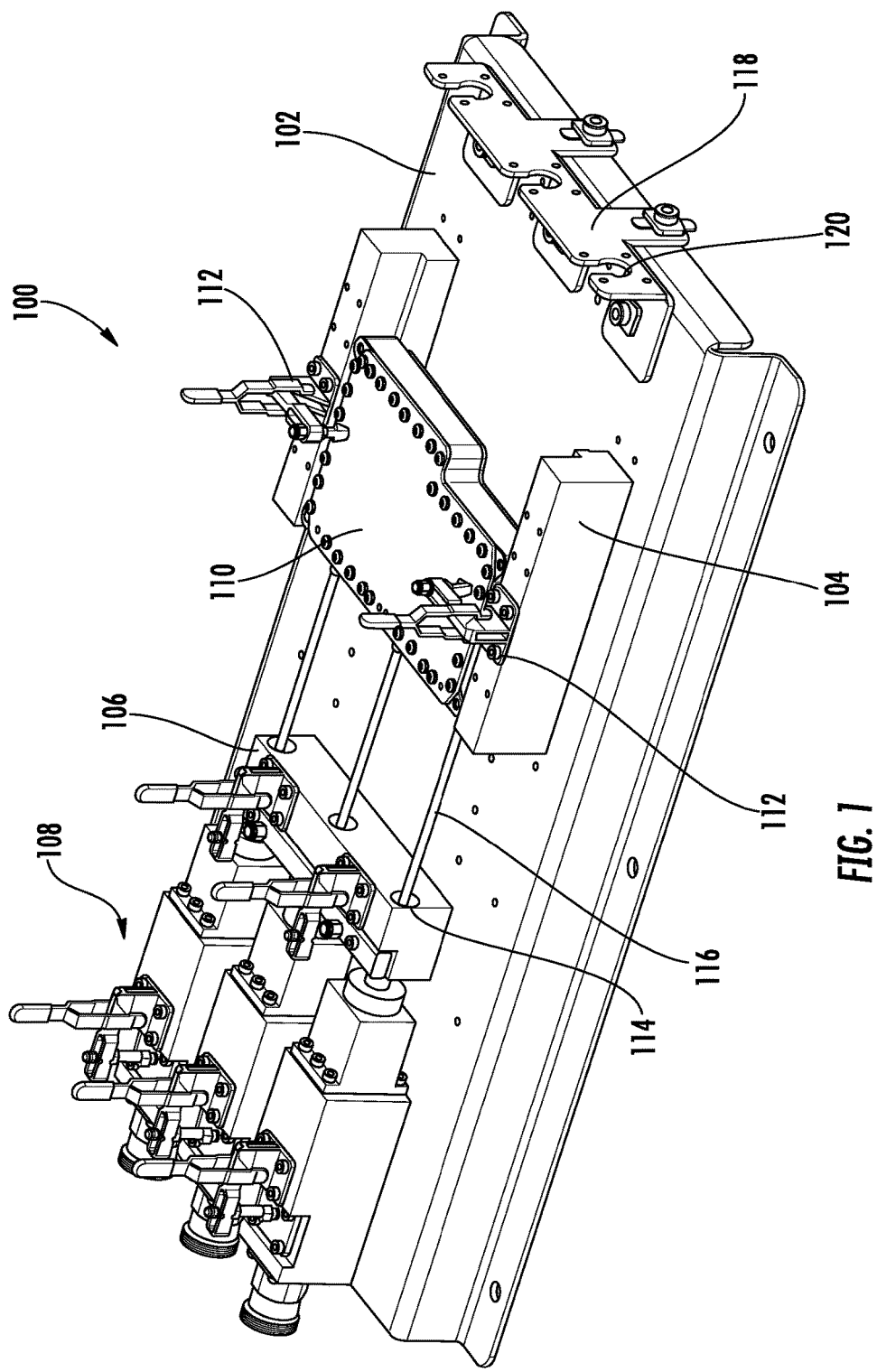
FIG. 1 is an illustration of a solderless text fixture according to an aspect of the present disclosure.

Certain terminology is used in the following description for convenience only and is not limiting. The words "lower," "bottom," "upper" and "top" designate directions in the drawings to which reference is made. Unless specifically set forth herein, the terms "a," "an" and "the" are not limited to one element, but instead should be read as meaning "at least one." The terminology includes the words noted above, derivatives thereof and words of similar import. It should also be understood that the terms "about," "approximately," "generally," "substantially" and like terms, used herein when referring to a dimension or characteristic of a component of the disclosure, indicate that the described dimension/characteristic is not a strict boundary or parameter and does not exclude minor variations therefrom that are functionally similar. At a minimum, such references that include a numerical parameter would include variations that, using mathematical and industrial principles accepted in the art (e.g., rounding, measurement or other systematic errors, manufacturing tolerances, etc.), would not vary the least significant digit.

FIG. 1 is an illustration of a solderless test fixture 100 according to an aspect of the present disclosure. The test fixture 100 may be used to more accurately realize testing and/or tuning of cables and/or components such as diplexers, filters, and the like. Testing may include performance testing such as return loss performance, isolation, PIM levels, and the like. As discussed herein, return loss may refer to an amount of degradation of incident signals caused by reflected signals. An increase in reflected signals may increase degradation of incident signals, thereby causing a loss in the quality of the incident signals. A higher return loss equates to increased downstream signal reflection. Therefore, minimizing the return loss maximizes the quality and fidelity of the downstream signals.

Generally, the test fixture 100 may include a base 102, a device support 104, a cable support 106, and a main frame 108. The device support 104 may support a device 110 to be tested, such as a duplexer, filter, or any other antenna component. The device support 104 may preferably be made of rigid plastic material; however, other materials may be contemplated in keeping with the spirit of the disclosure. One or more clamps 112 may be mounted on the device support 104 to hold the device 110 in position. The cable support 106 may include one or more openings 114 dimensioned to engage one or more respective cables 116 (e.g., connected to the device 110) to be tested. The cable support 106 may preferably be made of rigid plastic material; however, other materials may be contemplated in keeping with the spirit of the disclosure. Also, an endplate 118 may be attached to an end of the base 102. The endplate 118 may include one or more gaps 120 configured to hold one or more respective connectors of cables (e.g., trimmed cables) when the text fixture 100 is used for testing one or more cables with a single connector.

Figure 2:
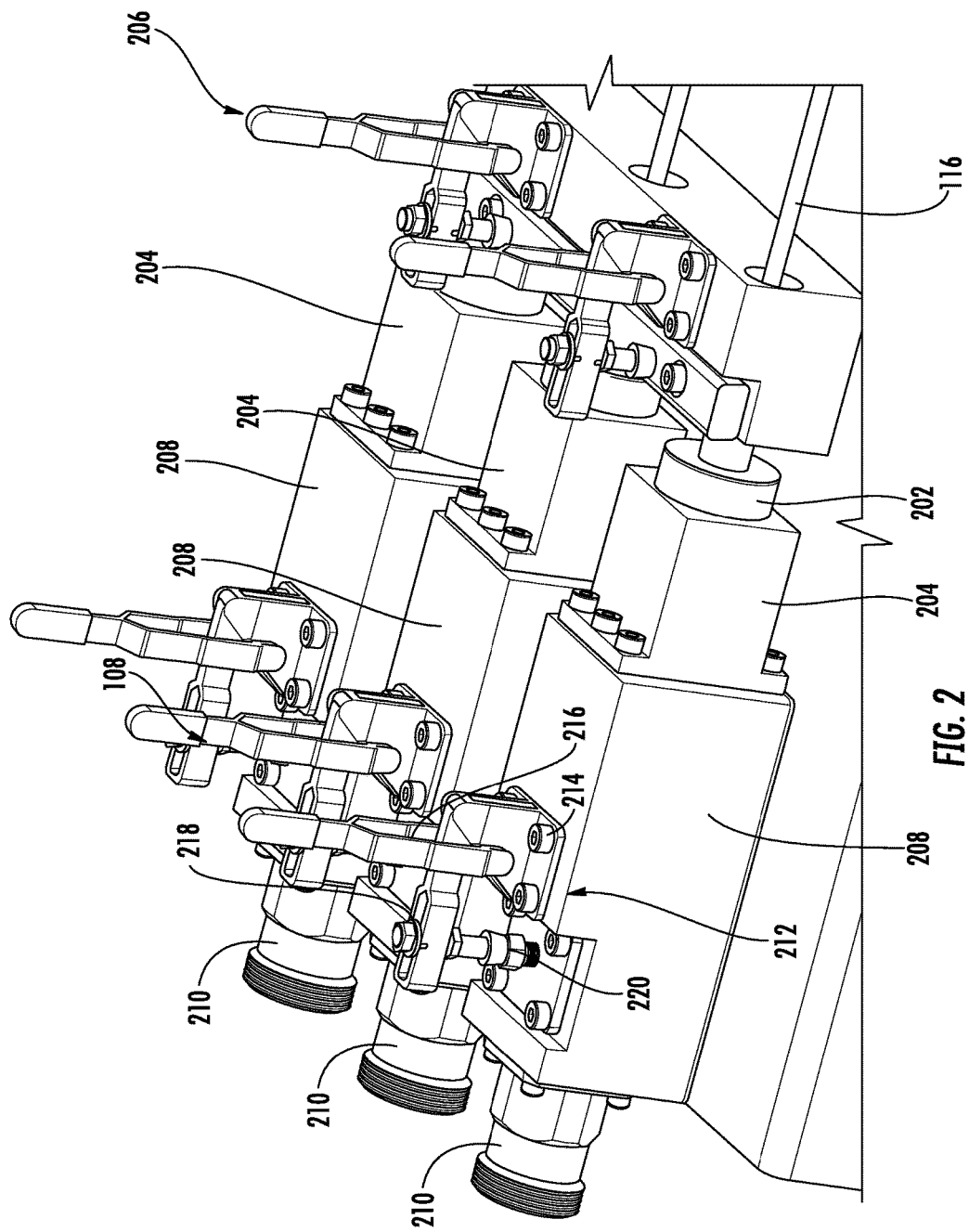
FIG. 2 is an enlarged view of the main frame of the solderless test fixture, according to an aspect of the present disclosure.

FIG. 2 is an enlarged view of the main frame 108 of the test fixture 100. On one end of the main frame 108, one or more plastic cable guides 202 may guide the respective cables 116 through respective chokes 302 (shown in FIG. 3A), enclosed by respective choke covers 204. One or more clamps 206 may be mounted on the cable support 106 to insure the cables 116 are held tight during testing. The choke covers 204 may be attached to respective test bodies 208, which, in turn, may be connected to respective DIN connectors 210, which may be 7/16 DIN connectors. Although 7/16 DIN connectors are shown, it should be noted that other connector types may be used in keeping with the disclosure.

A clamp 212 (which may be the same type of clamp as clamp 206) may be mounted on a test body 208. The clamp 212 may include a clamp base 214, a lever arm 216, a clamp arm 218, a clamping member 220 attached to and positioned substantially perpendicular to the clamp arm 218, a press bolt 222, and a spring 224 attached to the press bolt 222. When the clamp 212 is lifted up (e.g., when testing is complete, to switch cables, and the like), the spring 224 may be used to release any pressure from the press bolt 222 against the inner conductor of the cable 116. It should be noted that the configuration shown in FIG. 2 is by way of non-limiting example only. As such, the test fixture 100 may include, e.g., more or fewer than three test bodies 208, DIN connectors 210 attached thereto, chokes and choke covers 204 in keeping with the spirit of the disclosure.

Figure 3A:
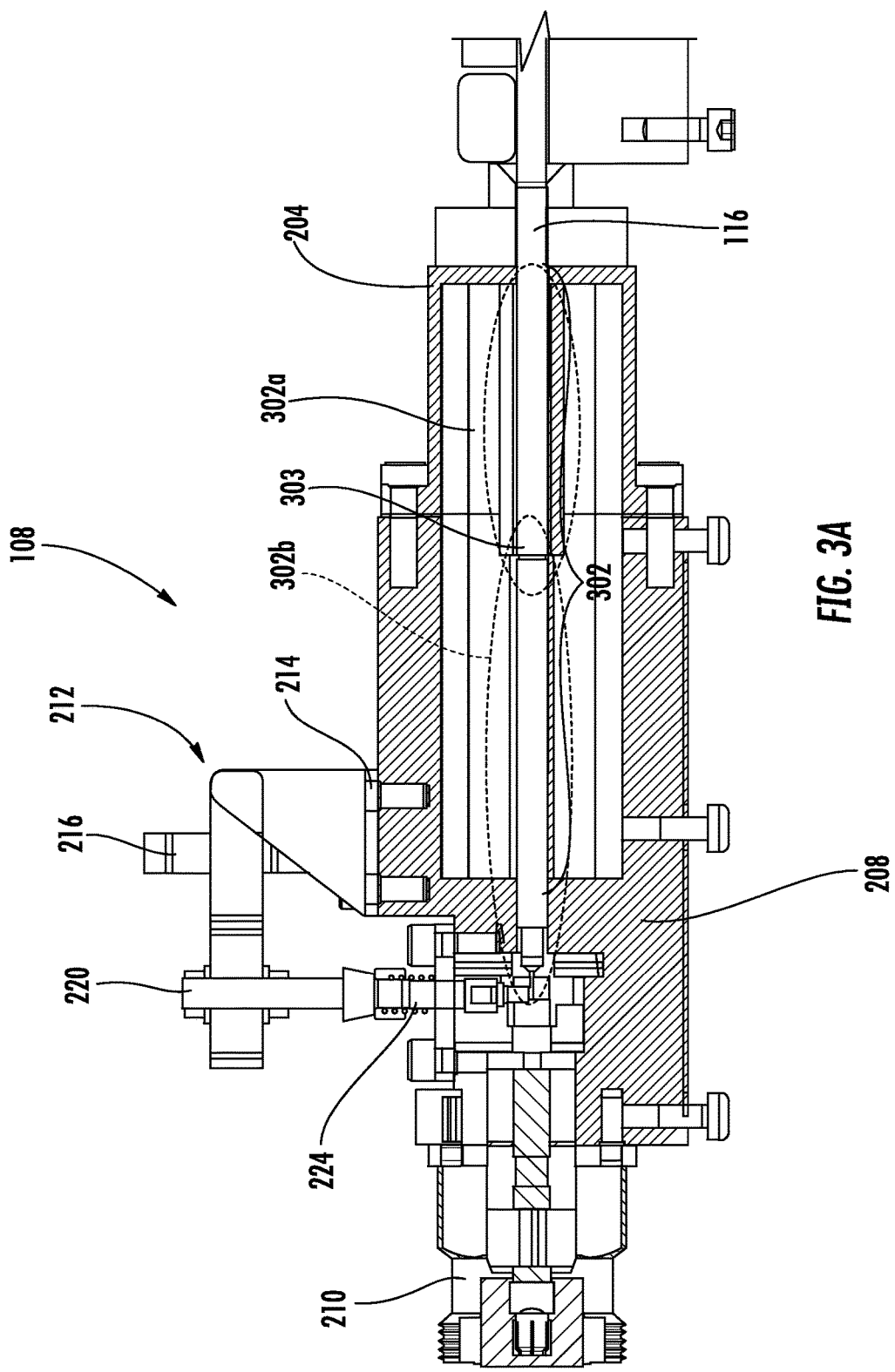
FIGS. 3A-3C are cross sectional views of a test body of the main frame, according to an aspect of the present disclosure.
Figure 3B:
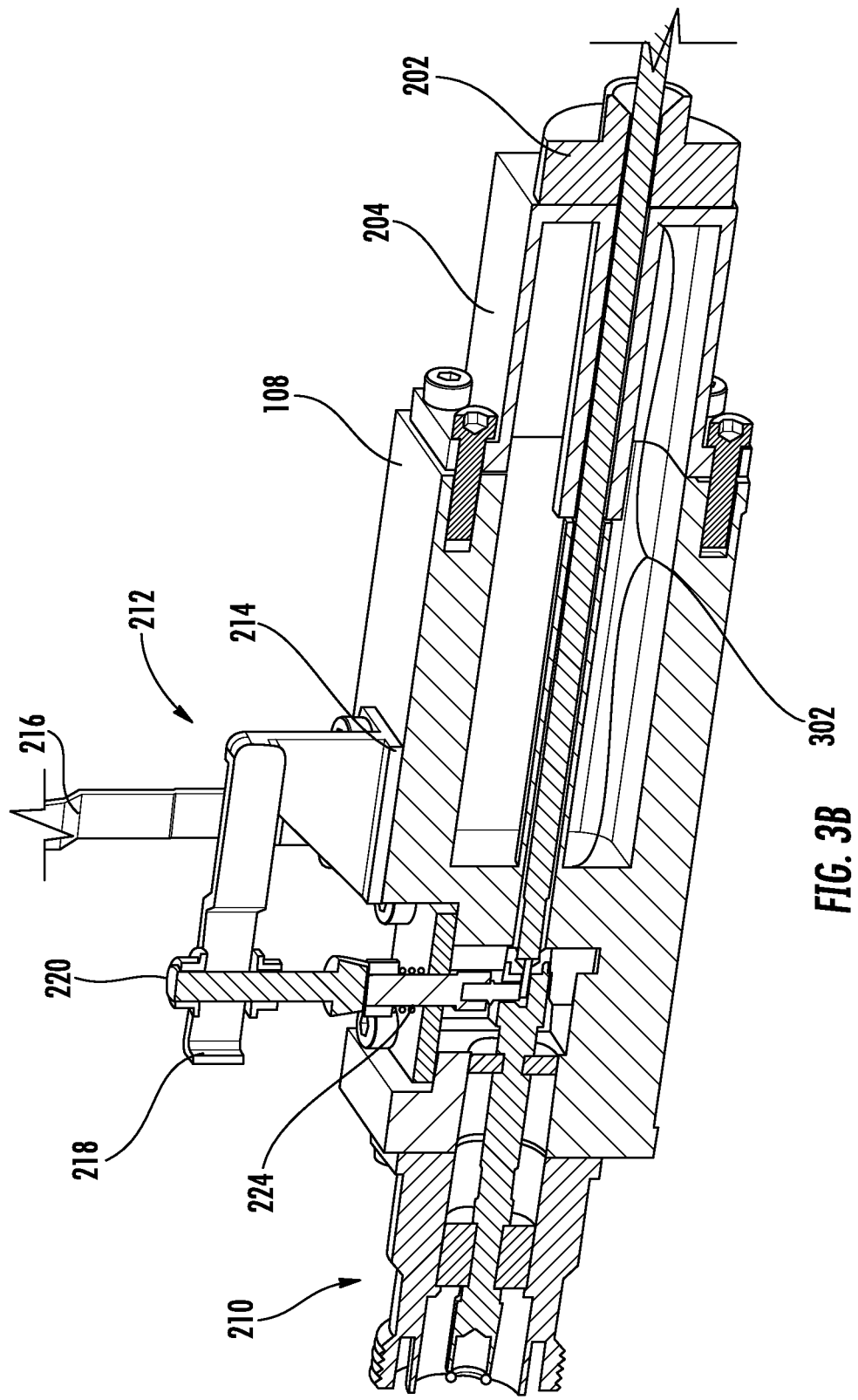

Referring now to FIGS. 3A and 3B, a cross section of the test body 208 of the main frame 108 is shown. The choke 302 may be formed by a cavity of the choke cover 204 and a portion of a cavity of the test body 208. Preferably, the choke 302 is about ¼ wavelength in length; however, other lengths may be contemplated in keeping with the spirit of the disclosure. The respective cavities of the choke cover 204 and the test body 208 may define two coupling sections 302a, 302b. As shown, the coupling section 302a may facilitate generation of a reversed current on an outer conductor of the cable 116. Such a reversed current may cancel out, or otherwise negate current that may leak from the coupling section 302b. As best seen in FIG. 3A, a gap 303 may exist between the coupling sections 302b and 302a.

Figure 3C:
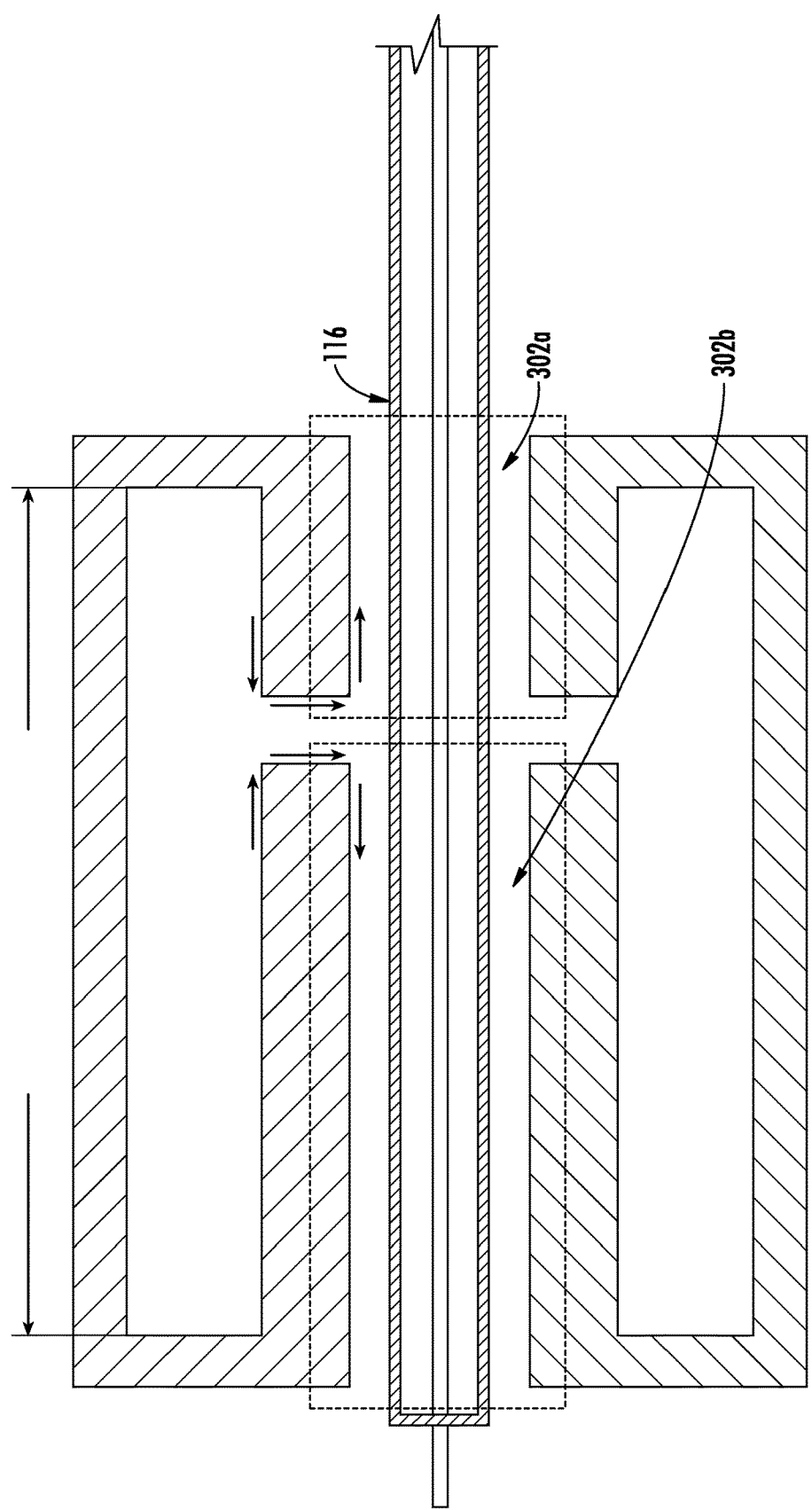

The coupling section 302b may be formed within the test body 208, and may use the quarter wavelength principle as known in the art, to ground current on an outer conductor of the cable 116 and to optimize the return loss performance of the test fixture. FIG. 3C provides a more detailed illustration of using the quarter wavelength principle. As shown, by using a quarter wavelength choke cavity, currents $i_a$ and $i_b$ travel in substantially opposite directions at the gap area. Thus, the coupled currents (e.g., $i_x$ and $i_y$) on the outer conductor of the cable 116 may also cancel each other out such that leaking current at location C may be significantly minimized. Further, it may use the jacket 404 of the cable 116 to isolate the outer conductor of the cable 116 so as to prevent metal to metal contact with the test body 208 so as to avoid the generation of PIM.

Figure 4:
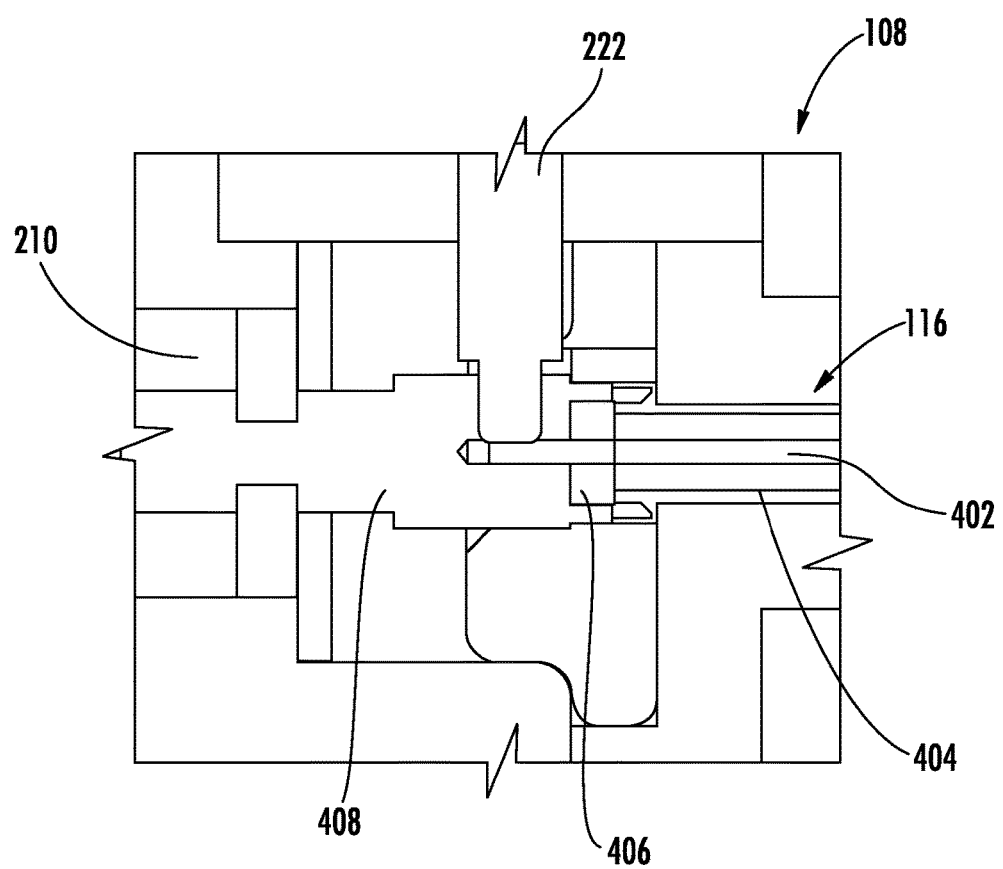
FIG. 4 is an enlarged cross sectional view of one of the test bodies of the main frame, according to an aspect of the present disclosure.

FIG. 4 is an enlarged cross sectional view of one of the test bodies 208, of the test fixture 100. More specifically, FIG. 4 illustrates the plastic press bolt 222, the cable 116 showing the inner conductor 402 of the cable 116 and jacket 404, a plastic isolator 406 in contact with the cable 116 under test, and an inner conductor 408 of the DIN connector 210. The plastic press bolt 222 may be attached to the spring (not shown) of the clamp (not shown) mounted on the test body 208. The press bolt 222 may be pressed downward by activation of the lever arm of the clamp. By being advanced downward, the press bolt 222 may exert a downward force on the inner conductor 402 of the cable 116 onto the inner conductor 408 of the DIN connector 210, ensuring a reliable contact therebetween. The plastic isolator 406 may act as a position limiter upon the cable 116.

Figure 5:
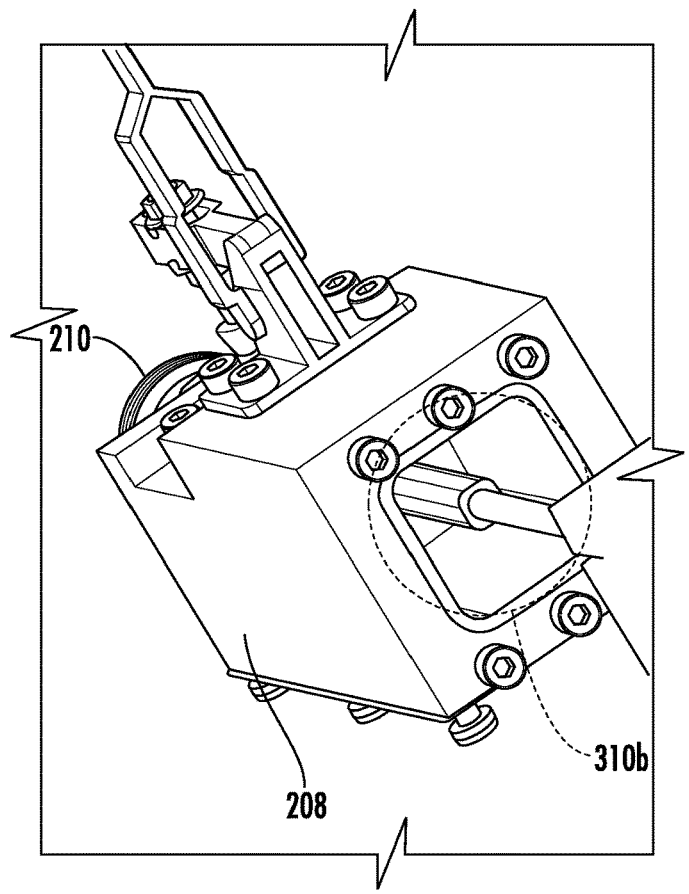
FIG. 5 is an enlarged partial inner view of one of the test bodies with a choke cover removed, according to an aspect of the present disclosure.
Figure 6:
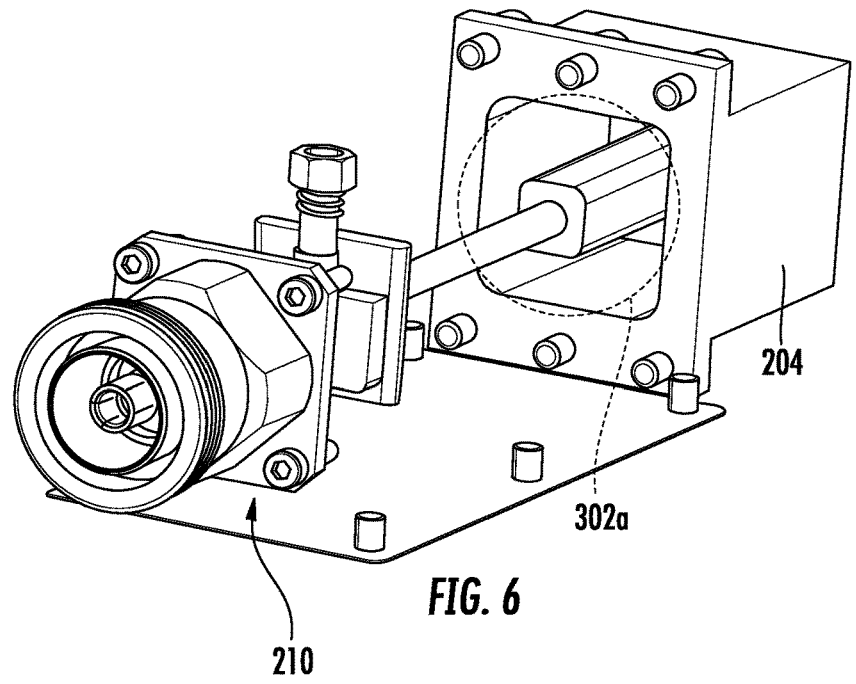
FIG. 6 is an enlarged partial inner view of the choke cover with the test body removed, according to an aspect of the present disclosure.

FIG. 5 is an enlarged partial inner view of one of the test bodies 208 with the choke cover 204 removed and illustrating the coupling section 302b of the test body 208, while FIG. 6 is an enlarged partial inner view of one of the choke covers 204 with the test body 208 removed and illustrating the coupling section 302a of the choke cover 204.

In use, a length of the cable 116 may be tested by stripping a portion of the outer part of the cable (e.g., jacket 404, outer conductor, and the dielectric in between the inner conductor and outer conductor) to reveal the inner conductor 402. One end of the cable 116 may be attached to a device 110 under test. The other (e.g., opposite end) of the cable 116 may be inserted through the plastic support 106 and plastic guides 202 into the test body 208 so that a portion of the inner conductor 402 of the cable 116 may be in contact with the inner conductor 408 of the DIN connector 210. Once inserted, the cables 116 may be clamped in place (such as by one or more of the clamps 212, 206). A load or test equipment (e.g., analyzer, oscilloscope, and the like) may be connected to one or more of the DIN connectors 210 for testing of the cable 116 and/or device 110. As discussed above, the testing may include PIM testing, return loss testing, and/or general tuning of the device 110 and/or cable 116. When the test is completed, the clamps 212, 206 may be released, and the cables 116 removed. There is no need to solder on connectors, or to discard used connectors.

As described hereinthroughout, a solderless test fixture may facilitate the testing of trimmed cables and/or other antenna components connected with cables. The solderless test fixture may use coupling technology to avoid direct metal to metal contact between an outer conductor of the cable and the main frame of the test fixture. Such a design may not only help to improve the PIM performance of the test fixture, but may also keep sufficient impedance matching from the cable to the test fixture in a wide range of frequencies. The choking and current reversing techniques discussed herein may significantly suppress any current leaking through cables attached to the test fixture, which may greatly improve PIM performance. Further, the main frame of the test fixture may be used multiple times, while some of the other components, such as the press bolt, which may be easy to wear out, is designed to be conveniently and quickly replaced.

Various embodiments of the disclosure have now been discussed in detail; however, the disclosure should not be understood as being limited to these embodiments. It should also be appreciated that various modifications, adaptations, and alternative embodiments thereof may be made within the scope and spirit of the present disclosure.

The invention claimed is:

1. A solderless test fixture for testing performance of at least one cable or at least one antenna component, the solderless test fixture comprising:
   a base; and
   at least one frame mounted on the base, wherein a respective one of the at least one frame includes:
      a choke cover including a first cavity defining a first coupling section; and
      a test body connected to the choke cover, the test body including a second cavity defining a second coupling section, the second cavity being adjacent to, collinear with and axially separated from the first cavity, wherein at least a portion of the first cavity and at least a portion of the second cavity define a radio frequency (RF) choke for the at least one cable.

2. The solderless test fixture of claim 1, further comprising:
   at least one connector connected to the at least one frame, the at least one connector including a solderless center terminal configured to be electrically connected to the at least one cable.

3. The solderless test fixture of claim 2, further comprising:
   at least one clamp mounted on the test body, wherein the at least one clamp is configured to secure an inner conductor of the at least one cable to the solderless center terminal.

4. The solderless test fixture of claim 1, further comprising:
   at least one cable guide dimensioned to guide the at least one cable through the RF choke.

5. The solderless test fixture of claim 1, further comprising:
   a device support mounted on the base; and
   at least one clamp configured to secure the at least one antenna component to the device support.

6. The solderless test fixture of claim 5, wherein the at least one antenna component is connected to the at least one cable.

7. The solderless test fixture of claim 1, wherein the RF choke is a quarter-wavelength choke.

8. The solderless test fixture of claim 2, wherein the at least one connector is connected to a load and/or to the test equipment.

9. A solderless test fixture for testing performance of at least one cable or at least one antenna component, the solderless test fixture comprising:
   a base; and
   at least one frame mounted on the base, wherein a respective one of the at least one frame includes:
      a choke cover including a first cavity defining a first coupling section; and
      a test body connected to the choke cover, the test body including a second cavity defining a second coupling section, wherein at least a portion of the first cavity and at least a portion of the second cavity define a radio frequency (RF) choke for the at least one cable;
   at least one connector connected to the at least one frame, the at least one connector including a solderless center terminal configured to be electrically connected to the at least one cable; and
   at least one clamp mounted on the test body, wherein the at least one clamp is configured to secure an inner conductor of the at least one cable to the solderless center terminal;
   wherein the at least one clamp includes at least one press bolt configured to exert a downward force on the inner conductor of the at least one cable onto the solderless center terminal of the at least one connector.

10. A solderless test fixture for testing performance of at least one cable or at least one antenna component, the solderless test fixture comprising:
    a base; and
    at least one frame mounted on the base, wherein a respective one of the at least one frame includes:
       a choke cover including a first cavity defining a first coupling section; and
       a test body connected to the choke cover, the test body including a second cavity defining a second coupling section, wherein at least a portion of the first cavity and at least a portion of the second cavity define a radio frequency (RF) choke for the at least one cable;
    at least one connector connected to the at least one frame, the at least one connector including a solderless center terminal configured to be electrically connected to the at least one cable; and
    at least one clamp mounted on the test body, wherein the at least one clamp is configured to secure an inner conductor of the at least one cable to the solderless center terminal;
    wherein the at least one clamp includes a biasing member configured to exert a downward force on the inner conductor of the at least one cable onto the solderless center terminal of the at least one connector.

* * * * *